(12) United States Patent
Chen et al.

(10) Patent No.: US 9,412,650 B2
(45) Date of Patent: Aug. 9, 2016

(54) INTERCONNECT STRUCTURE AND METHOD OF FORMING THE SAME

(71) Applicant: Taiwan Semiconductor Manufacturing Company, Ltd., Hsin-Chu (TW)

(72) Inventors: Jeng-Shiou Chen, Kaohsiung (TW); Chih-Yuan Ting, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 59 days.

(21) Appl. No.: 13/791,278

(22) Filed: Mar. 8, 2013

(65) Prior Publication Data

US 2014/0252636 A1    Sep. 11, 2014

(51) Int. Cl.
*H01L 23/48* (2006.01)
*H01L 21/336* (2006.01)
*H01L 21/768* (2006.01)
*H01L 23/522* (2006.01)
*H01L 23/532* (2006.01)

(52) U.S. Cl.
CPC ...... *H01L 21/7682* (2013.01); *H01L 21/76829* (2013.01); *H01L 21/76831* (2013.01); *H01L 23/5222* (2013.01); *H01L 23/53295* (2013.01); *H01L 2924/0002* (2013.01)

(58) Field of Classification Search
CPC ............ H01L 21/768; H01L 21/76816; H01L 21/76838; H01L 21/28026; H01L 21/823475; H01L 21/823871; H01L 23/552; H01L 25/16; H01L 27/14636; H01L 2224/19; H01L 2224/25; H01L 2225/06541
USPC ......... 257/774, 522, 419, 773, 758, 737, 499, 257/762, 764, 506; 438/303, 591, 618, 421, 438/584, 637, 783, 763
See application file for complete search history.

(56) References Cited

U.S. PATENT DOCUMENTS

| | | | |
|---|---|---|---|
| 2007/0178713 A1* | 8/2007 | Jeng .............................. | 438/787 |
| 2008/0182405 A1* | 7/2008 | Liu et al. ...................... | 438/623 |
| 2010/0164117 A1* | 7/2010 | Chen ............................. | 257/774 |
| 2011/0076831 A1* | 3/2011 | Chen ................. | H01L 21/76807 438/421 |

* cited by examiner

*Primary Examiner* — Julio J Maldonado
*Assistant Examiner* — Moin Rahman
(74) *Attorney, Agent, or Firm* — Slater Matsil, LLP

(57) ABSTRACT

An interconnect structure and a method of forming an interconnect structure are disclosed. The interconnect structure includes a lower etch stop layer (ESL); a middle low-k (LK) dielectric layer over the lower ESL; a supporting layer over the middle LK dielectric layer; an upper LK dielectric layer over the supporting layer; an upper conductive feature in the upper LK dielectric layer, wherein the upper conductive feature is through the supporting layer; a gap along an interface of the upper conductive feature and the upper LK dielectric layer; and an upper ESL over the upper LK dielectric layer, the upper conductive feature, and the gap.

20 Claims, 15 Drawing Sheets

INTERCONNECT STRUCTURE AND METHOD OF FORMING THE SAME

BACKGROUND

The fabrication of integrated chips can be broadly separated into two main sections, front-end-of-the-line (FEOL) fabrication and back-end-of-the-line (BEOL) fabrication. FEOL fabrication includes the formation of devices (e.g., transistors, capacitors, resistors, etc.) within a semiconductor substrate. BEOL fabrication includes the formation of one or more metal interconnect layers comprised within one or more insulating dielectric layers disposed above the semiconductor substrate. The metal interconnect layers of the BEOL electrically connect individual devices of the FEOL to external pins of an integrated chip.

As the size of a semiconductor device size decreases, the capacitive coupling between the metal interconnect layers of the BEOL tends to increase since the capacitive coupling is inversely proportional to the distance between the metal interconnect layers. This coupling may ultimately limit the speed of the chip or otherwise inhibit proper chip operation if steps are not taken to reduce the capacitive coupling. Accordingly, a need has developed in the art for an improved method of forming an interconnect structure for an integrated chip.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
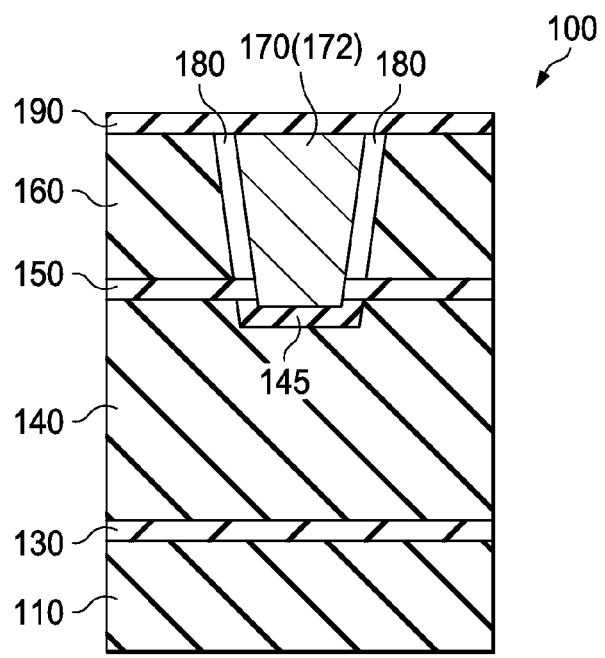
FIG. 1A is a cross-sectional view of an interconnect structure 100 according to various aspects of the present disclosure.

The present disclosure relates generally to semiconductor structures, and more particularly, to methods of forming a gap-containing interconnect structure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "under", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter. It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

There is a need for new methods that provide low RC time constants for advanced semiconductor devices, wherein "R" is the resistance of the on-chip wiring and "C" is the effective capacitance between the signal lines and the surrounding conductors in the multilevel interconnection stack. RC time constants are reduced by lowering the specific resistance of the wiring material, and by using dielectrics with lower dielectric constants, k. Traditional semiconductor fabrication commonly employs silicon dioxide ($SiO_2$) as a dielectric, which has a k of approximately 3.9. Implementation of organic materials to reduce k also reduces the overall BEOL capacitance. Instead of using $SiO_2$ and organic materials, another approach is to implement a gap, such as air, which is provided in the form of a gap-containing interconnect structure. Even a small air gap near the wire results in a significant improvement in the overall k for a structure, e.g., a 10% air gap per edge will reduce the effective k of a dielectric by approximately 15%.

FIG. 1A is a cross-sectional view of an interconnect structure 100 according to various aspects of the present disclosure. As depicted in FIG. 1A, the interconnect structure 100 comprises a lower etch stop layer (ESL) 130; a middle low-k (LK) dielectric layer 140 over the lower ESL 130; a supporting layer 150 over the middle LK dielectric layer 140; an upper LK dielectric layer 160 over the supporting layer 150; an upper conductive feature 170 in the upper LK dielectric layer 160, wherein the upper conductive feature 170 is through the supporting layer 150; a gap 180 along an interface of the upper conductive feature 170 and the upper LK dielectric layer 160; and an upper ESL 190 over the upper LK dielectric layer 160, the upper conductive feature 170, and the gap 180. The interconnect structure 100 may further comprise a lower LK dielectric layer 110 below the lower ESL 130; and a lower conductive feature in the lower LK dielectric layer 110. (A layer 145 will be described later on.)

A dielectric material of the lower LK dielectric layer 110, the middle LK dielectric layer 140, or the upper LK dielectric layer 160 comprises an oxide, $SiO_2$, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PE-TEOS), fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. In some embodiments, k is between about 1.5 and about 2.8. The lower LK dielectric layer 110, the middle LK dielectric layer 140, or the upper LK dielectric layer 160 may be formed by atomic layer deposition (ALD), chemical vapor deposition (CVD), physical vapor deposition (PVD), or combinations thereof.

The material for the lower ESL 130, the supporting layer 150, or the upper ESL 190 includes SiO, SiC, SiN, SiOC, SiON, SiCN, TiN, AlN, AlON, TEOS, hard black diamond (HBD), or the like. Alternatively, the lower ESL 130, the supporting layer 150, or the upper ESL 190 may be formed by depositing and annealing a metal oxide material, which includes hafnium (Hf), hafnium oxide ($HfO_2$), or aluminum (Al). The lower ESL 130, the supporting layer 150, or the upper ESL 190 may be formed using a suitable process such as ALD, CVD, PVD, molecular beam epitaxy (MBE), spin-on, or combinations thereof. In some embodiments, the lower ESL 130, the supporting layer 150, or the upper ESL 190 has a thickness in a range from about 10 angstrom (Å) to about 300 angstrom (Å). In some embodiments, the supporting layer 150 is configured to provide support, such as physical or mechanical support, for the upper conductive feature 170 when the gap 180 (or 182) is formed.

In some embodiments, the upper conductive feature 170 comprises copper (Cu), aluminum (Al), silver (Ag), gold (Au), or alloys thereof. The upper conductive feature 170 may also comprise one or more barrier layers selected from a group of W, WN, Ti, Al, TiAl, TiN, TiAlN, Ta, TaC, TaN, TaCN, TaSiN, Mn, Zr, Nb, or Ru. The upper conductive feature 170 may be formed by a process including, but not limited to, ALD, CVD, PVD, sputtering, plating, or combinations thereof. A planarization process, such as a chemical-mechanical planarization/polishing (CMP) process, may be performed to planarize at least one of the upper LK dielectric layer 160 or the upper conductive feature 170.

Figure 1B:
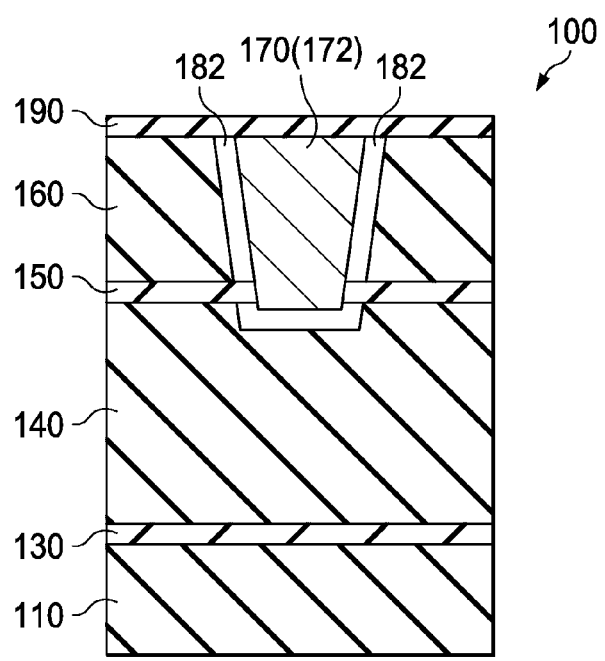
FIG. 1B is another cross-sectional view of the interconnect structure 100 according to various aspects of the present disclosure.

FIG. 1B is another cross-sectional view of the interconnect structure 100 according to various aspects of the present disclosure. FIG. 1B is similar to FIG. 1A except that a bottom surface of a gap 182 in FIG. 1B is lower than a bottom surface of the gap 180 in FIG. 1A. In some embodiments, the gap 180 comprises air. In some embodiments, the gap 182 comprises air. For example, the air gap is associated with a k=1. Accordingly, the air gap of the interconnect structure 100 facilitates improved RC performance with respect to a gap associated with a k higher than 1, for example. However, gap materials other than air are contemplated. In some embodiments, the gap 180 (or 182) has a width in a range from about 1 Å to about 100 Å.

As depicted in FIGS. 1A and 1B, the bottom surface of the gap 180 is over a bottom surface of the supporting layer 150, while the bottom surface of the gap 182 is below the bottom surface of the supporting layer 150. In some embodiments, the upper conductive feature 170 comprises a metal line 172, the metal line 172 extending through the supporting layer 150. The bottom surface of the supporting layer 150 is substantially coplanar with a bottom surface of the metal line 172. In some embodiments, the bottom surface of the supporting layer 150 is over the bottom surface of the metal line 172. So, the purpose of the metal line 172 extending through the supporting layer 150 is to provide support for the metal line 172 of the upper conductive feature 170 to prevent it from collapsing when the gap 180 (or 182) is formed.

The interconnect structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 2A:
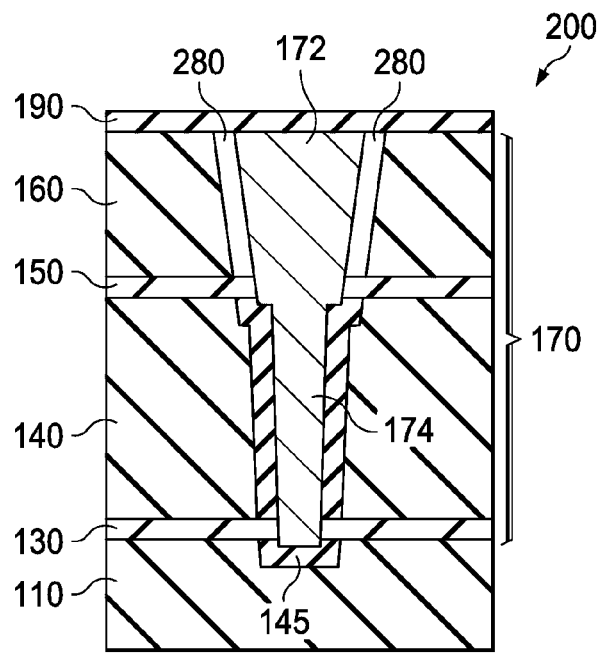
FIGS. 2A-2C are cross-sectional views of an interconnect structure 200 according to various aspects of the present disclosure.
Figure 2B:
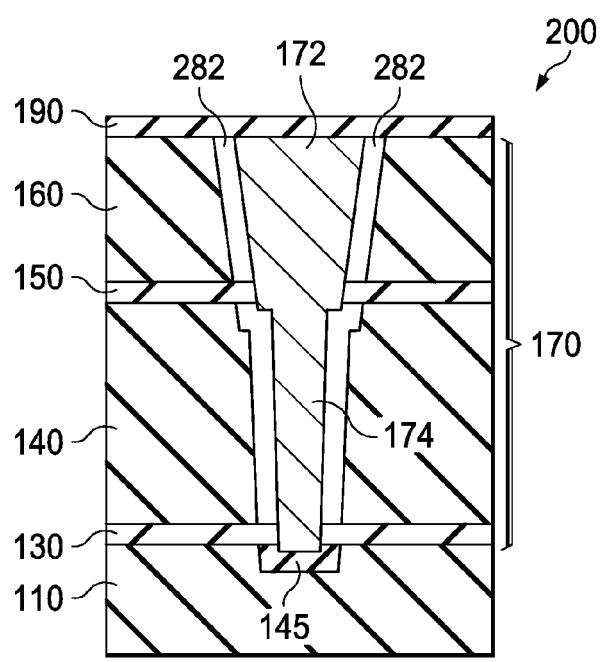
Figure 2C:
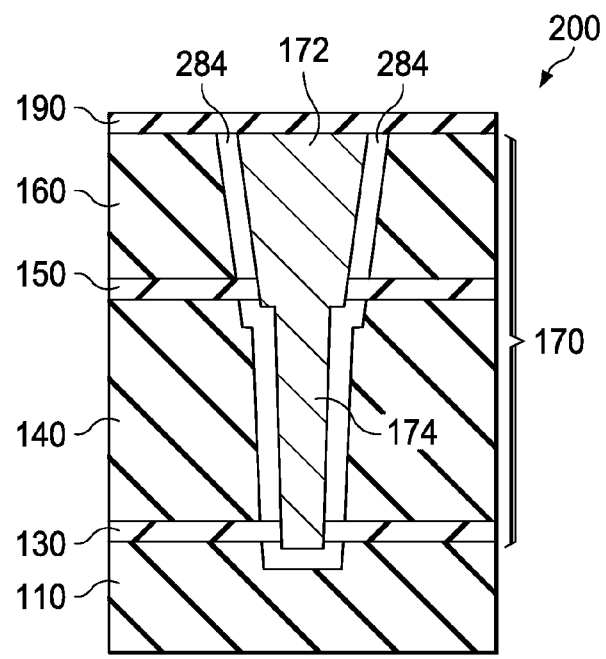

FIGS. 2A-2C are cross-sectional views of an interconnect structure 200 according to various aspects of the present disclosure. FIGS. 2A-2C are similar to FIGS. 1A-1B except that a via 174 is connected to the metal line 172. As depicted in FIG. 2A, a gap 280 is along an interface of the upper conductive feature 170 (the metal line 172) and the upper LK dielectric layer 160. The upper conductive feature 170 further comprises the via 174 in the middle LK dielectric layer 140, the via 174 being contiguous with the metal line 172 and through the lower ESL 130. As depicted in FIG. 2B, a gap 282 is further along an interface of the via 174 and the middle LK dielectric layer 140 (compared to the gap 280 in FIG. 2A). A bottom surface of the gap 282 is over a bottom surface of the lower ESL 130. As depicted in FIG. 2C, a gap 284 is further along an interface of the via 174 and the lower LK dielectric layer 110 (compared to the gap 282 in FIG. 2B). A bottom surface of the gap 284 is below the bottom surface of the lower ESL 130. As depicted in FIGS. 2A-2C, in some embodiments, the gap 280 (or 282, 284) has a width in a range from about 1 Å to about 100 Å. In some embodiments, the lower ESL 130 is configured to provide support, such as physical or mechanical support, for the via 174 of the upper conductive feature 170 to prevent it from collapsing when the gap 282 (or 284) is formed.

Figure 3A:
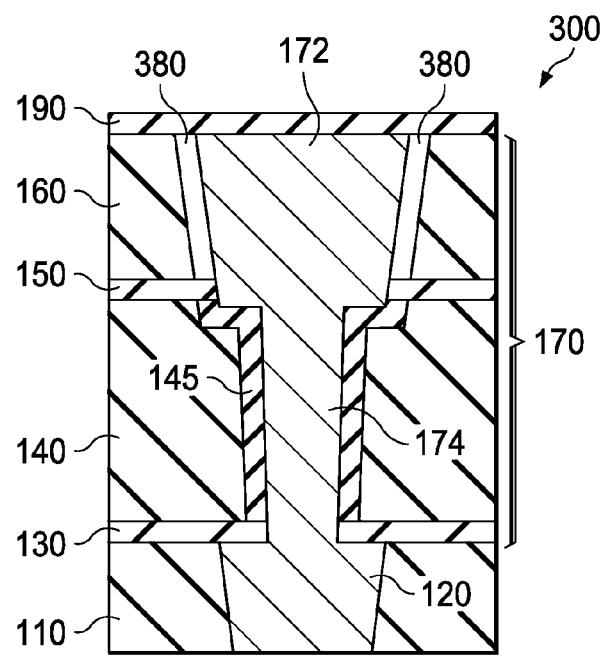
FIGS. 3A-3C are cross-sectional views of an interconnect structure 300 according to various aspects of the present disclosure.
Figure 3B:
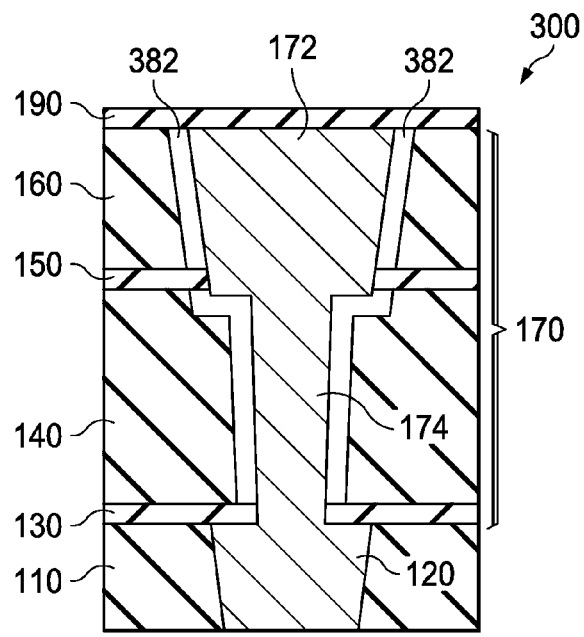
Figure 3C:
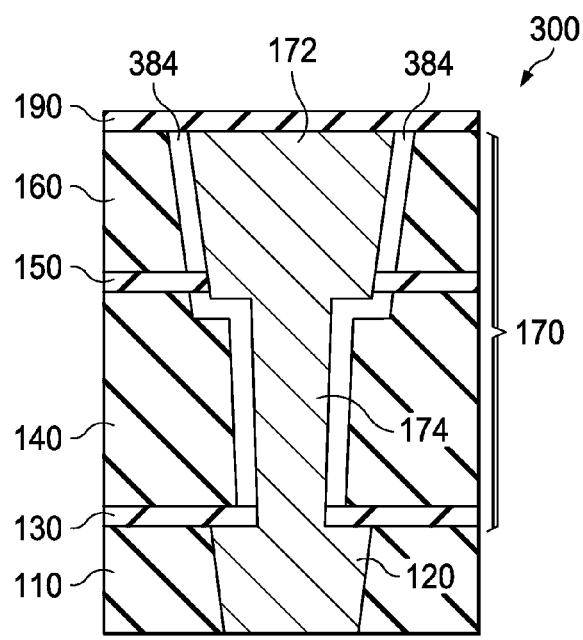

FIGS. 3A-3C are cross-sectional views of an interconnect structure 300 according to various aspects of the present disclosure. FIGS. 3A-3C are similar to FIGS. 2A-2C except that the via 174 is further connected to a lower conductive feature 120. As depicted in FIGS. 3A-3C, the interconnect structure 300 further comprises the lower LK dielectric layer 110 below the lower ESL 130; and the lower conductive feature 120 in the lower LK dielectric layer 110. The lower conductive feature 120 may be formed using a suitable process such as ALD, CVD, PVD, sputtering, plating, or combinations thereof. In some embodiments, the lower conductive feature 120 comprises a metal line or a gate electrode. The metal line comprises copper (Cu), aluminum (Al), silver (Ag), gold (Au), or alloys thereof. The metal line may also comprise one or more barrier layers selected from a group of W, WN, Ti, Al, TiAl, TiN, TiAlN, Ta, TaC, TaN, TaCN, TaSiN, Mn, Zr, Nb, or Ru. In some embodiments, the gate electrode may comprise a single-layer or multilayer structure. In one embodiment, the gate electrode comprises poly-silicon. Further, the gate electrode may be doped poly-silicon with the uniform or non-uniform doping. In an alternative embodiment, the gate electrode comprises a metal selected from a group of W, Cu, Ti, Ag, Au, Al, TiAl, TiAlN, TaC, TaCN, TaSiN, Mn, or Zr. In an alternative embodiment, the gate electrode comprises a metal selected from a group of TiN, WN, TaN, or Ru. In an alternative embodiment, the gate electrode has a thickness in a range from about 30 nm to about 60 nm.

As depicted in FIGS. 3A-3C, the upper conductive feature 170 further comprises the via 174 in the middle LK dielectric layer 140, the via 174 extending through the lower ESL 130 and connected to the lower conductive feature 120. As depicted in FIG. 3A, a gap 380 is along an interface of the upper conductive feature 170 (the metal line 172) and the upper LK dielectric layer 160. As depicted in FIG. 3B, a gap 382 is further along an interface of the via 174 and the middle LK dielectric layer 140 (compared to the gap 380 in FIG. 3A), and a bottom surface of the gap 382 is over the lower conductive feature 120. Similarly, as depicted in FIG. 3C, a gap 384 is further along an interface of the via 174 and the lower ESL 130 (compared to the gap 382 in FIG. 3B), and a bottom surface of the gap 384 is over the lower conductive feature 120. As depicted in FIGS. 3A-3C, in some embodiments, the gap 380 (or 382, 384) has a width in a range from about 1 Å to about 100 Å.

Figure 4A:
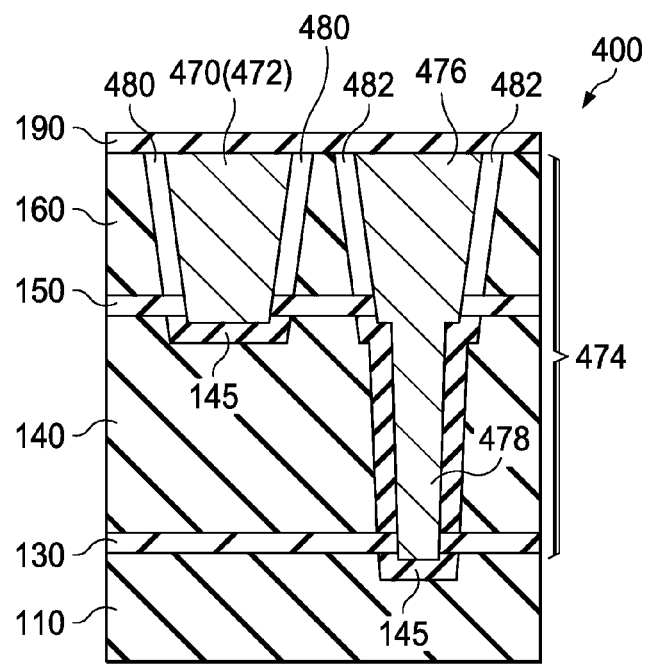
FIGS. 4A-4C are cross-sectional views of an interconnect structure 400 according to various aspects of the present disclosure.
Figure 4B:
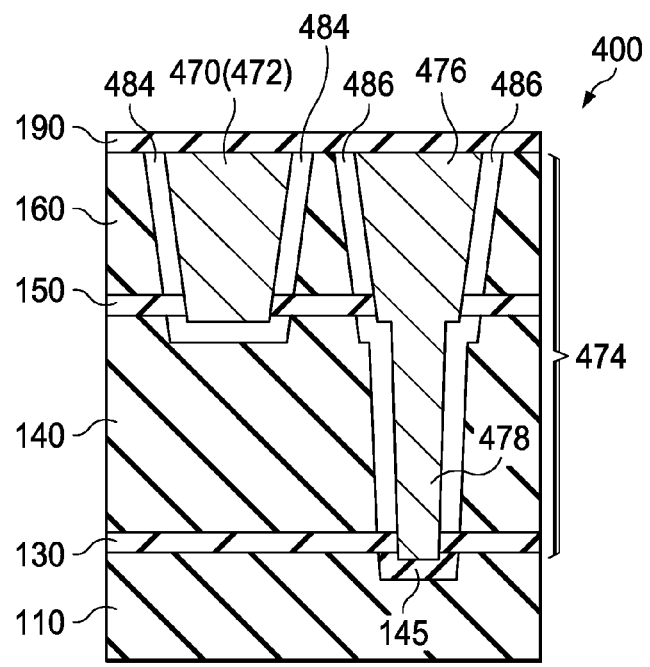
Figure 4C:
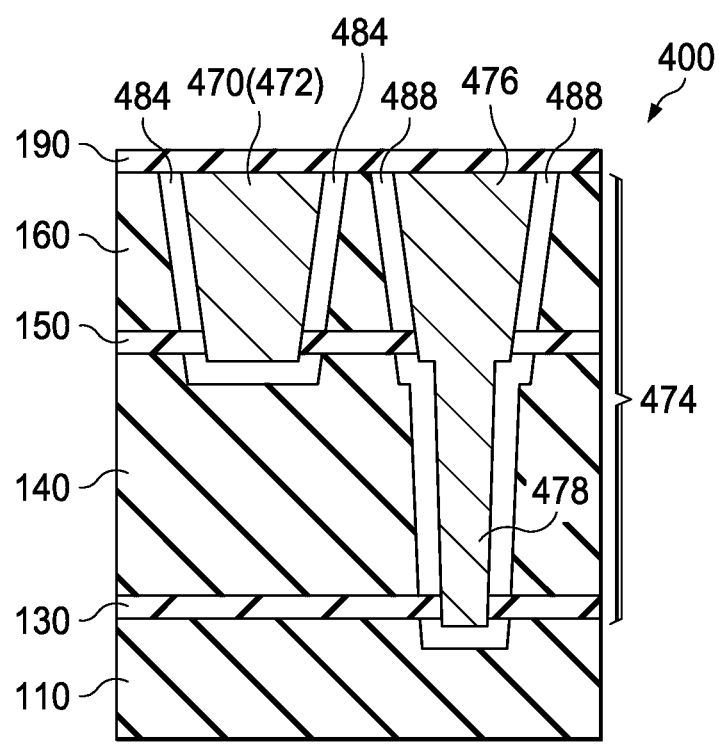

FIGS. 4A-4C are cross-sectional views of an interconnect structure 400 according to various aspects of the present disclosure. As depicted in FIG. 4A, the interconnect structure 400 comprises a lower etch stop layer (ESL) 130; a middle low-k (LK) dielectric layer 140 over the lower ESL 130; a supporting layer 150 over the middle LK dielectric layer 140; an upper LK dielectric layer 160 over the supporting layer 150; a first conductive feature 470 having a first metal line 472 in the upper LK dielectric layer 160, wherein the first metal line 472 is through the supporting layer 150; a second conductive feature 474 having a second metal line 476 in the upper LK dielectric layer 160 and a via 478 contiguous with the second metal line 476 in the middle LK dielectric layer 140, wherein the second metal line 476 is through the supporting layer 150 and the via 478 is through the lower ESL 130; a first gap 480 along an interface of the first conductive feature 470 and the upper LK dielectric layer 160; a second gap 482 along an interface of the second conductive feature 474 and the upper LK dielectric layer 160; and an upper ESL 190 over the upper LK dielectric layer 160, the first conductive feature 470, the second conductive feature 474, the first gap 480, and the second gap 482. In some embodiments, a bottom surface of the first gap 480 or the second gap 482 is over a bottom surface of the supporting layer 150. The interconnect structure 400 may further comprise a lower LK dielectric layer 110 below the lower ESL 130; and a lower conductive feature in the lower LK dielectric layer 110. The via 478 may be further connected to the lower conductive feature.

As depicted in FIG. 4B, a bottom surface of a first gap 484 or a second gap 486 is below the bottom surface of the supporting layer 150. The first gap 484 is further along an interface of the first conductive feature 470 and the middle LK dielectric layer 140 (compared to the first gap 480 in FIG. 4A). The second gap 486 is further along an interface of the second conductive feature 474 and the middle LK dielectric layer 140 (compared to the second gap 482 in FIG. 4A). Similarly, as depicted in FIG. 4C, a bottom surface of the first gap 484 or a second gap 488 is below the bottom surface of the supporting layer 150. The second gap 488 is further along an interface of the second conductive feature 474 and the lower LK dielectric layer 110 (compared to the second gap 486 in FIG. 4B).

As depicted in FIGS. 4A-4C, in some embodiments, the first gap 480, 484 (or the second gap 482, 486, 488) has a width in a range from about 1 Å to about 100 Å. In some embodiments, the bottom surface of the supporting layer 150 is substantially coplanar with a bottom surface of the metal line 472 (or the metal line 476). In some embodiments, the bottom surface of the supporting layer 150 is over the bottom surface of the metal line 472 (or the metal line 476). So, the purpose of the metal line 472 (or the metal line 476) through the supporting layer 150 is to provide support for the metal line 472 (or the metal line 476) to prevent it from collapsing when the first gap 480, 484 (or the second gap 482, 486, 488) is formed. Similarly, the purpose of the via 478 through the lower ESL 130 is to provide support for the via 478 to prevent it from collapsing when the second gap 486 (or 488) is formed.

Figure 5:
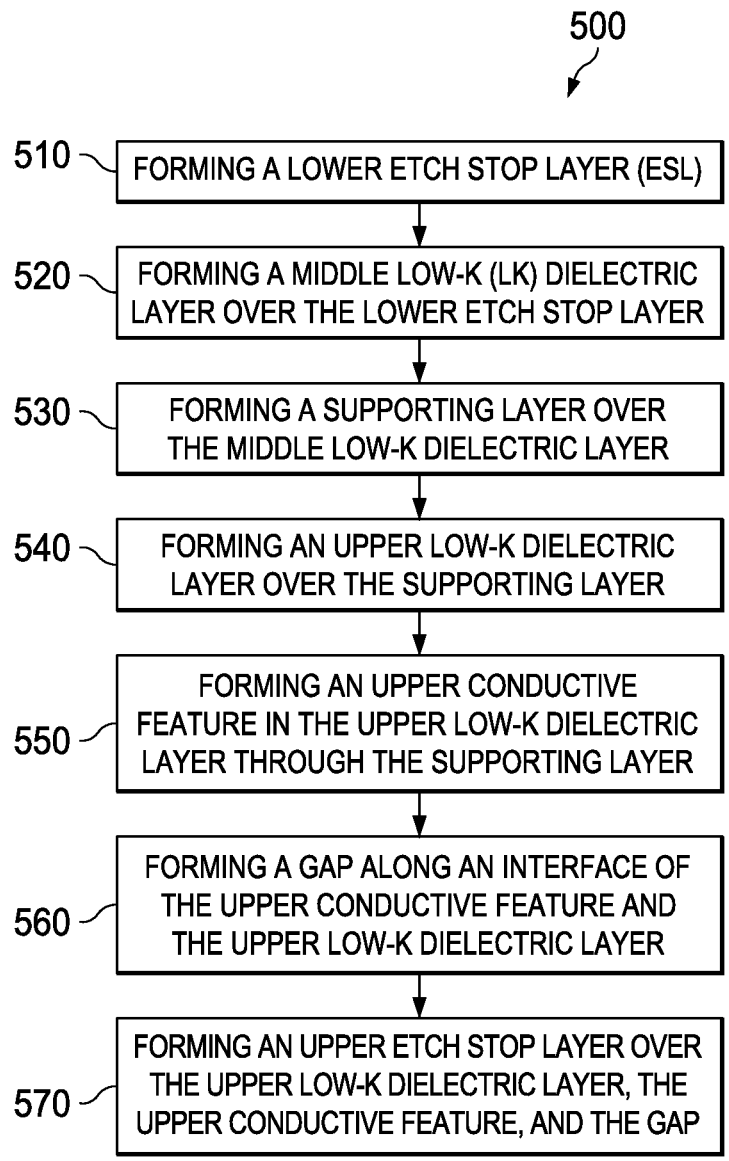
FIG. 5 is a flowchart of a method 500 of forming the interconnect structure 100 according to various aspects of the present disclosure.

FIG. 5 is a flowchart of a method 500 of forming the interconnect structure 100 according to various aspects of the present disclosure. It is understood that additional steps can be provided before, during, and after the method 500, and some of the steps described can be replaced or eliminated for other embodiments of the method 500. The method 500 begins at step 510 in which a lower etch stop layer (ESL) is formed. The method 500 continues with step 520 in which a middle low-k (LK) dielectric layer is formed over the lower ESL. The method 500 continues with step 530 in which a supporting layer is formed over the middle LK dielectric layer. The method 500 continues with step 540 in which an upper LK dielectric layer is formed over the supporting layer. The method 500 continues with step 550 in which an upper conductive feature is formed in the upper LK dielectric layer through the supporting layer. The method 500 continues with step 560 in which a gap is formed along an interface of the upper conductive feature and the upper LK dielectric layer. The method 500 continues with step 570 in which an upper ESL is formed over the upper LK dielectric layer, the upper conductive feature, and the gap. The gap may be further formed along an interface of the upper conductive feature and the middle LK dielectric layer. A lower LK dielectric layer 110 may be further formed below the lower ESL 130, and a lower conductive feature may be further formed in the lower LK dielectric layer 110. The discussion that follows illustrates embodiments of the interconnect structure 100 that can be fabricated according to the method 500 of FIG. 5.

Figure 6:
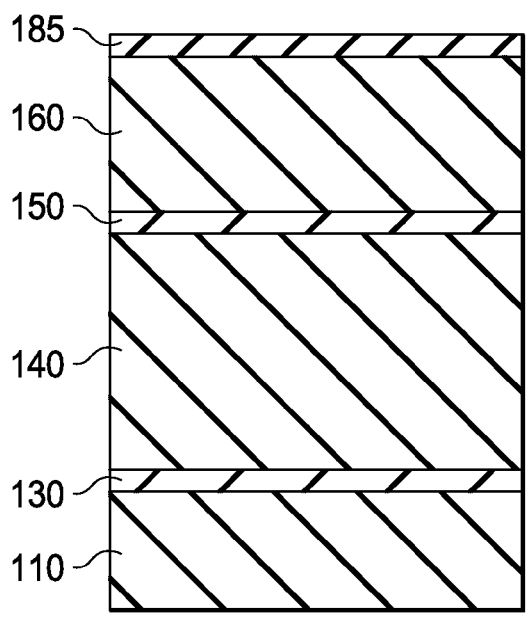
FIGS. 6-10B are cross-sectional views of the interconnect structure 100 at various stages of fabrication according to various aspects of the present disclosure.

FIGS. 6-10B are cross-sectional views of the interconnect structure 100 at various stages of fabrication according to various aspects of the present disclosure. As depicted in FIG. 6 and steps 510, 520, 530, 540 in FIG. 5, the method 500 begins at step 510 by forming a lower etch stop layer (ESL) 130. The method 500 continues with step 520 by forming a middle low-k (LK) dielectric layer 140 over the lower ESL 130. The method 500 continues with step 530 by forming a supporting layer 150 over the middle LK dielectric layer 140. The method 500 continues with step 540 by forming an upper LK dielectric layer 160 over the supporting layer 150. The method 500 may further comprise forming a lower LK dielectric layer 110 below the lower ESL 130; and a lower conductive feature in the lower LK dielectric layer 110. In some embodiments, the lower conductive feature comprises a metal line or a gate electrode. The method 500 may further comprise forming a hard mask layer 185 over the upper LK dielectric layer 160. In some embodiments, the hard mask layer 185 includes a dielectric material, such as silicon oxide, silicon nitride, silicon oxynitride, or other suitable materials. In some embodiments, the hard mask layer 185 includes a metal nitride compound, such as TiN. The hard mask layer 185 may be deposited using an ALD, CVD, PVD process, or combinations thereof.

The lower ESL 130 or the supporting layer 150 may be formed using a suitable process such as ALD, CVD, PVD, MBE, spin-on, or combinations thereof. The material for the lower ESL 130 or the supporting layer 150 includes SiO, SiC, SiN, SiOC, SiON, SiCN, TiN, AlN, AlON, TEOS, hard black diamond (HBD), or the like. Alternatively, the lower ESL 130 or the supporting layer 150 may be formed by depositing and annealing a metal oxide material, which includes hafnium (Hf), hafnium oxide ($HfO_2$), or aluminum (Al). In some embodiments, the lower ESL 130 or the supporting layer 150 has a thickness in a range from about 10 Å to about 300 Å.

The lower LK dielectric layer 110, the middle LK dielectric layer 140, or the upper LK dielectric layer 160 may be formed by ALD, CVD, PVD, or combinations thereof. A dielectric material of the lower LK dielectric layer 110, the middle LK dielectric layer 140, or the upper LK dielectric layer 160 comprises an oxide, $SiO_2$, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PE-TEOS), fluorine-doped silicon oxide, carbon-doped silicon oxide, porous silicon oxide, porous carbon-doped silicon oxide, organic polymers, or silicone based polymers. The dielectric material is associated with a dielectric constant (k) less than 3.9. In some embodiments, k is between about 1.5 and about 2.8.

Figure 7:
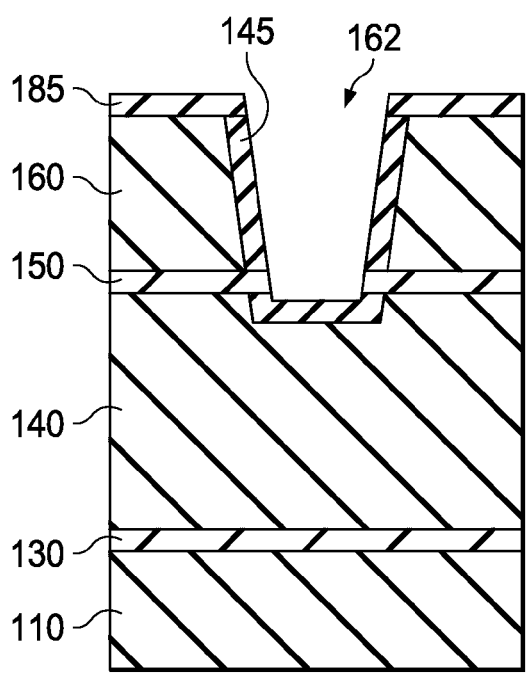
Figure 8:
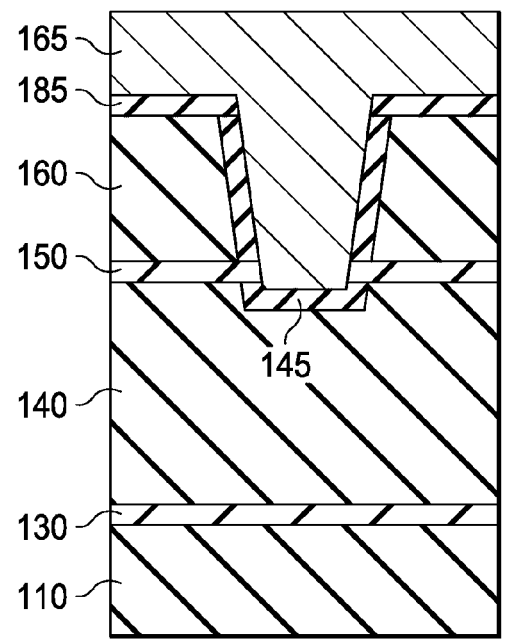
Figure 9:
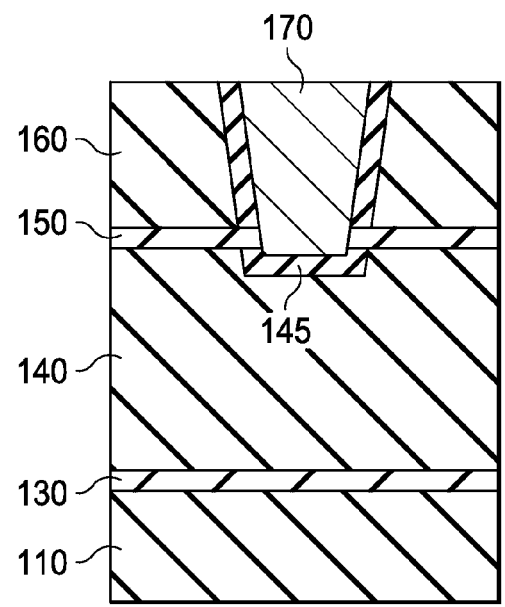

As depicted in FIGS. 7-9 and step 550 in FIG. 5, the method 500 continues with step 550 by forming an upper conductive feature 170 in the upper LK dielectric layer 160 through the supporting layer 150. As depicted in FIG. 7, step 550 comprises forming an opening 162 in the upper LK dielectric layer 160 through the supporting layer 150. The opening 162 may include a trench through the supporting layer 150 and/or a via plug hole through the lower ESL 130. The opening 162 is formed by a photolithography process (e.g., patterning the hard mask layer 185 first) followed by a dry etching process containing plasma. The dry etching process may be a single step or a multiple step etching process. The dry etching process may be an anisotropic etching process. The dry etching process may use reactive ion etch (RIE) and/or other suitable process. In one example, a dry etching process is used to etch the upper LK dielectric layer 160 (and/or the middle LK dielectric layer 140) that includes a chemistry including fluorine-containing gas. A layer 145 of processed (e.g., plasma damaged) LK dielectric material is formed along a wall of the opening 162 during the dry etching process. The dry etching process containing plasma makes a carbon concentration of the layer 145 become lower than that of the non-processed LK dielectric material. The processed LK dielectric material has a higher dielectric constant (k) than the non-processed LK dielectric material does. Too much processed LK dielectric material will make the k value of the upper LK dielectric layer 160 (and/or the middle LK dielectric layer 140) unpredictable. In some embodiments, the layer 145 has a width in a range from about 1 Å to about 100 Å.

As depicted in FIG. 8, step 550 comprises forming a metal layer 165 in the opening 162. The metal layer 165 may be formed by a process including, but not limited to, ALD, CVD, PVD, sputtering, plating, or combinations thereof. The metal layer 165 comprises Cu, Al, Ag, Au, or alloys thereof. The metal layer 165 may also comprise one or more barrier layers selected from a group of W, WN, Ti, Al, TiAl, TiN, TiAlN, Ta, TaC, TaN, TaCN, TaSiN, Mn, Zr, Nb, or Ru. As depicted in FIG. 9, step 550 comprises performing CMP on at least one of the upper LK dielectric layer 160 or the metal layer 165 to form the upper conductive feature 170 in the upper LK dielectric layer 160.

Figure 10A:
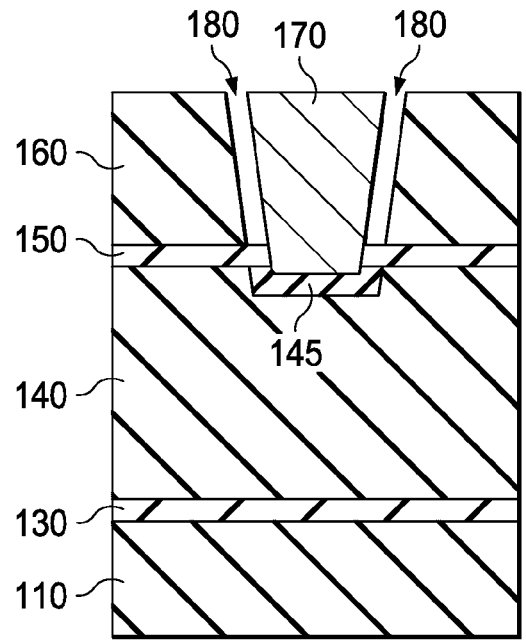

As depicted in FIG. 10A, and step 560 in FIG. 5, the method 500 continues with step 560 by forming a gap 180 along an interface of the upper conductive feature 170 and the upper LK dielectric layer 160. In some embodiments, step 560 is performed by removing a portion of the upper LK dielectric layer 160 along the interface by a wet etching process. The wet etching process may use a chemical including fluorine-containing species and metal inhibitors. As mentioned above, the layer 145 of processed (e.g., plasma damaged) LK dielectric material is formed along a wall of the opening 162 during the dry etching process. Actually, the LK dielectric material along the wall of the opening 162 is associated with a wall etch rate by the wet etching process. Additionally, the LK dielectric material along a top portion of the upper LK dielectric layer 160 is associated with a top etch rate by the wet etching process. Typically, the wall etch rate is different from the top etch rate. For example, processed LK dielectric material is generally associated with a faster etch rate, such as a processed etch rate, than non-processed LK dielectric material associated with a non-processed etch rate, thus making the processed LK dielectric material more easily removable than the non-processed LK dielectric material. Because the carbon concentration of the processed LK dielectric material is lower than that of the non-processed LK dielectric material (caused by the dry etching process containing plasma), the structure of the processed LK dielectric material is weaker and easier to be removed by the wet etching process. For example, the wall etch rate is associated with the processed etch rate, and the top etch rate is associated with the non-processed etch rate. Once the layer 145 of processed LK dielectric material is removed, the gap 180 is formed along the interface of the upper conductive feature 170 and the upper LK dielectric layer 160. In some embodiments, the supporting layer 150 is configured to provide support, such as physical or mechanical support, for the upper conductive feature 170 when the gap 180 is formed.

Figure 10B:
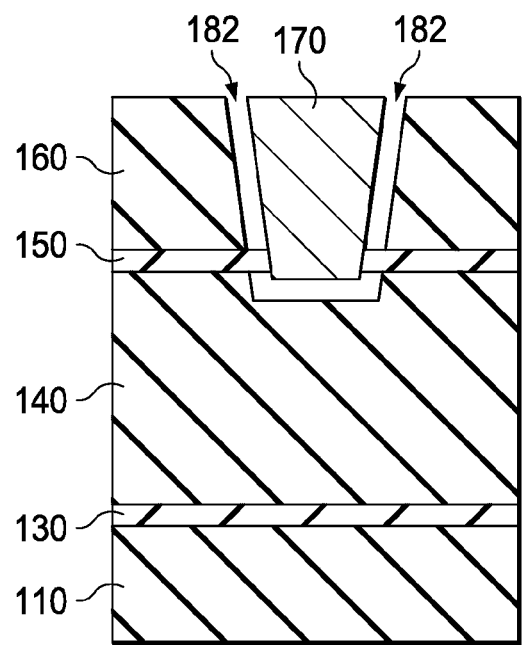

As depicted in FIG. 10B, in addition to forming a gap 182 along an interface of the upper conductive feature 170 and the upper LK dielectric layer 160, the method 500 may further comprise forming the gap 182 along an interface of the upper conductive feature 170 and the middle LK dielectric layer 140. In some embodiments, it is performed by further removing a portion of the middle LK dielectric layer 140 along the interface by the wet etching process. Once the layer 145 of processed LK dielectric material is removed, the gap 182 is formed along the interface of the upper conductive feature 170 and the upper LK dielectric layer 160, and along the interface of the upper conductive feature 170 and the middle LK dielectric layer 140. In some embodiments, the supporting layer 150 is configured to provide support, such as physical or mechanical support, for the upper conductive feature 170 when the gap 182 is formed.

FIG. 10B is similar to FIG. 10A except that a bottom surface of the gap 182 in FIG. 10B is lower than a bottom surface of the gap 180 in FIG. 10A. The difference between the gap 180 and the gap 182 can be controlled by the wet etching time. When the wet etching time is short, the processed LK dielectric material over the supporting layer 150 will be removed. When the wet etching time becomes longer, the processed LK dielectric material under the supporting layer 150 will also be removed because the wet chemical can penetrate through an interface of the upper conductive feature 170 and the supporting layer 150. That's why the bottom surface of the gap 180 is over the supporting layer 150 while the bottom surface of the gap 182 is below the supporting layer 150.

As depicted in FIGS. 1A and 1B, and step 570 in FIG. 5, the method 500 continues with step 570 by forming an upper ESL 190 over the upper LK dielectric layer 160, the upper conductive feature 170, and the gap 180 (or 182). The upper ESL 190 may be formed using a suitable process such as ALD, CVD, PVD, MBE, spin-on, or combinations thereof. The material for the upper ESL 190 includes SiO, SiC, SiN, SiOC, SiON, SiCN, TiN, AlN, AlON, TEOS, hard black diamond (HBD), or the like. Alternatively, the upper ESL 190 may be formed by depositing and annealing a metal oxide material, which includes hafnium (Hf), hafnium oxide (HfO$_2$), or aluminum (Al). In some embodiments, the upper ESL 190 has a thickness in a range from about 10 Å to about 300 Å.

Figure 11:
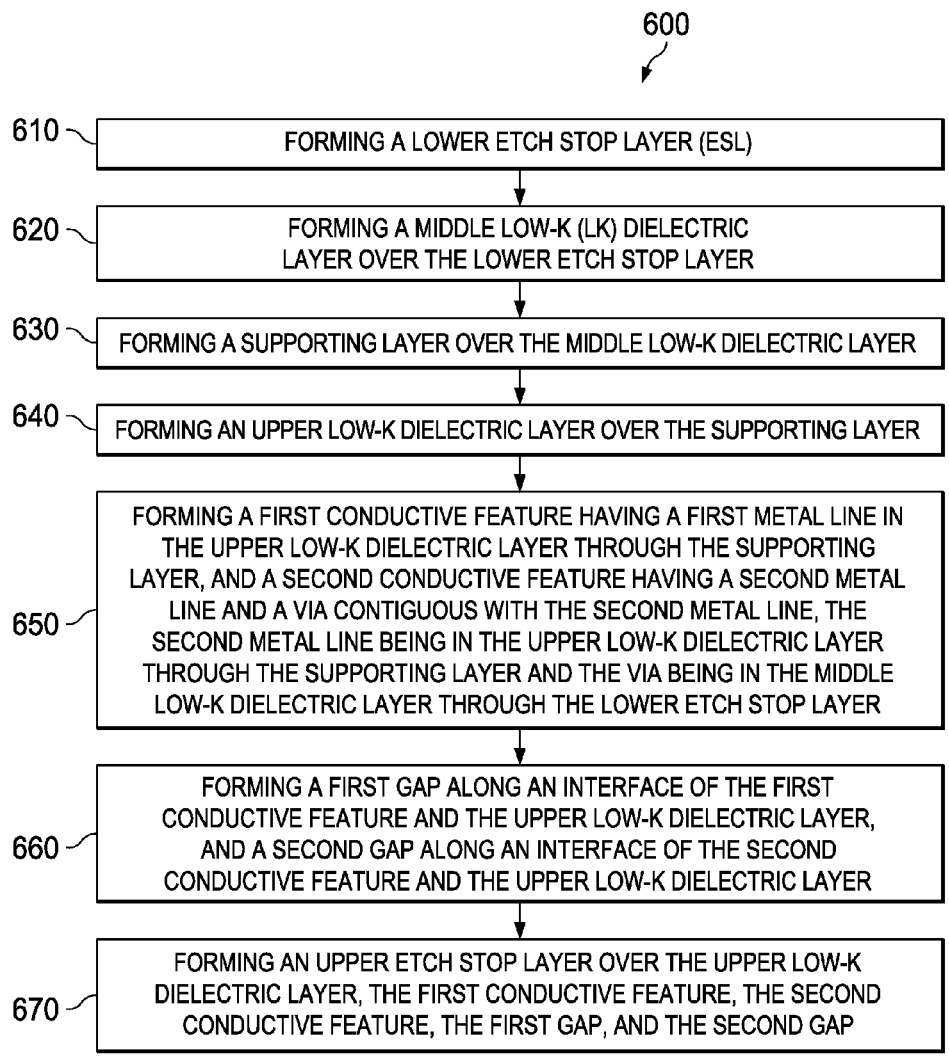
FIG. 11 is a flowchart of a method 600 of forming the interconnect structure 400 according to various aspects of the present disclosure.

FIG. 11 is a flowchart of a method 600 of forming the interconnect structure 400 according to various aspects of the present disclosure. It is understood that additional steps can be provided before, during, and after the method 600, and some of the steps described can be replaced or eliminated for other embodiments of the method 600. The method 600 begins at step 610 in which a lower etch stop layer (ESL) is formed. The method 600 continues with step 620 in which a middle low-k (LK) dielectric layer is formed over the lower ESL. The method 600 continues with step 630 in which a supporting layer is formed over the middle LK dielectric layer. The method 600 continues with step 640 in which an upper LK dielectric layer is formed over the supporting layer. The method 600 continues with step 650 in which a first conductive feature having a first metal line is formed in the upper LK dielectric layer through the supporting layer, and a second conductive feature having a second metal line and a via contiguous with the second metal line is formed, the second metal line being in the upper LK dielectric layer through the supporting layer and the via being in the middle LK dielectric layer through the lower ESL. The method 600 continues with step 660 in which a first gap is formed along an interface of the first conductive feature and the upper LK dielectric layer, and a second gap is formed along an interface of the second conductive feature and the upper LK dielectric layer. The method 600 continues with step 670 in which an upper ESL is formed over the upper LK dielectric layer, the first conductive feature, the second conductive feature, the first gap, and the second gap. The second gap may be further formed along an interface of the second conductive feature and the middle LK dielectric layer. A lower LK dielectric layer 110 may be further formed below the lower ESL 130, and a lower conductive feature may be further formed in the lower LK dielectric layer 110. The via may be further connected to the lower conductive feature. The discussion that follows illustrates embodiments of the interconnect structure 400 that can be fabricated according to the method 600 of FIG. 11.

Figure 12:
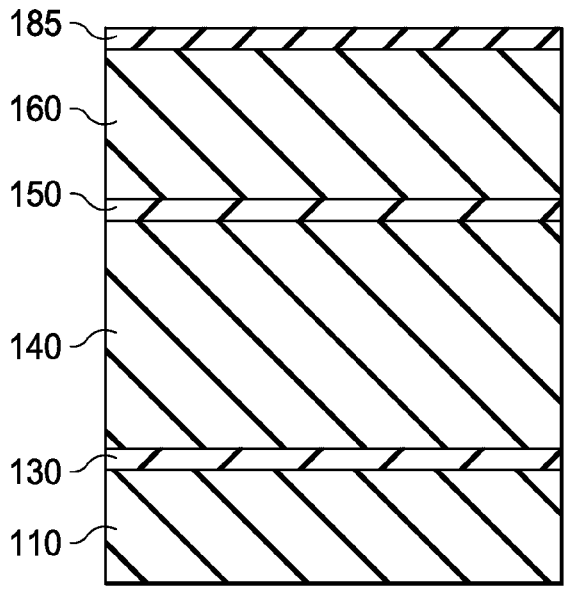
FIGS. 12-16C are cross-sectional views of the interconnect structure 400 at various stages of fabrication according to various aspects of the present disclosure.

FIGS. 12-16C are cross-sectional views of the interconnect structure 400 at various stages of fabrication according to various aspects of the present disclosure. As depicted in FIG. 12 and steps 610, 620, 630, 640 in FIG. 11, the method 600 begins at step 610 by forming a lower etch stop layer (ESL) 130. The method 600 continues with step 620 by forming a middle low-k (LK) dielectric layer 140 over the lower ESL 130. The method 600 continues with step 630 by forming a supporting layer 150 over the middle LK dielectric layer 140. The method 600 continues with step 640 by forming an upper LK dielectric layer 160 over the supporting layer 150. The method 600 may further comprise forming a lower LK dielectric layer 110 below the lower ESL 130; and a lower conductive feature in the lower LK dielectric layer 110. In some embodiments, the lower conductive feature comprises a metal line or a gate electrode. The method 600 may further comprise forming a hard mask layer 185 over the upper LK dielectric layer 160.

Figure 13:
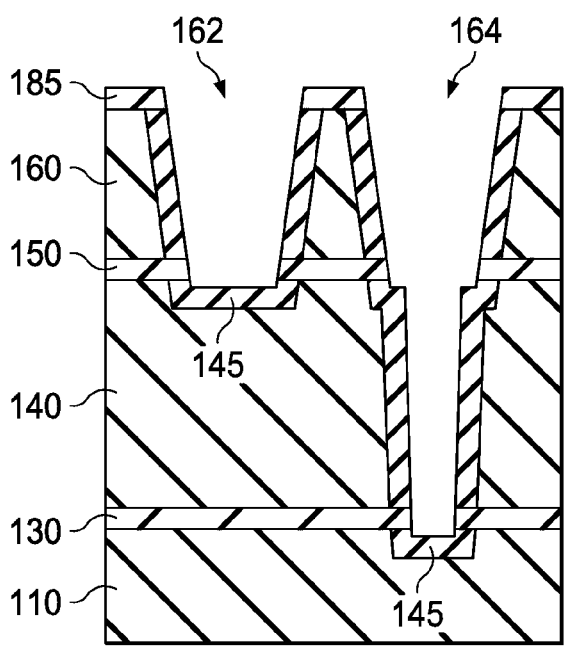
Figure 14:
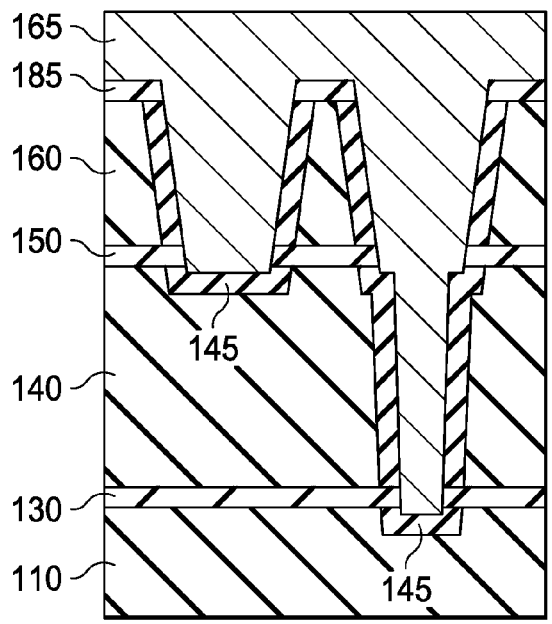
Figure 15:
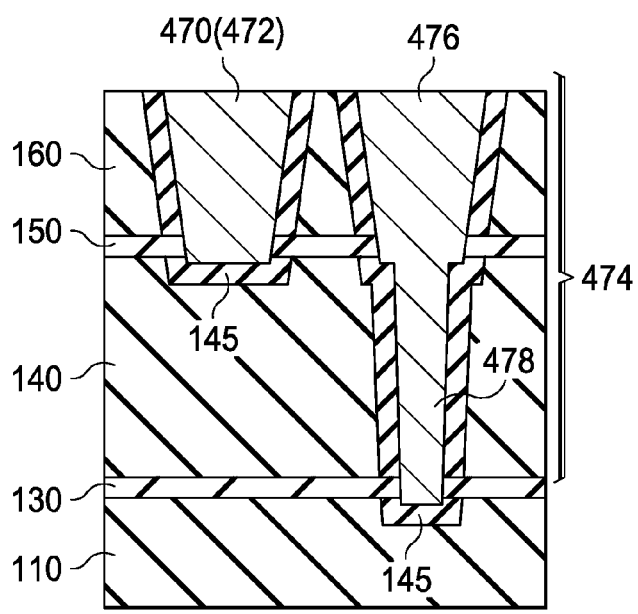

As depicted in FIGS. 13-15 and step 650 in FIG. 11, the method 600 continues with step 650 by forming a first conductive feature 470 having a first metal line 472 in the upper LK dielectric layer 160 through the supporting layer 150, and a second conductive feature 474 having a second metal line 476 and a via 478 contiguous with the second metal line 476, the second metal line 476 being in the upper LK dielectric layer 160 through the supporting layer 150 and the via 478 being in the middle LK dielectric layer 140 through the lower ESL 130. As depicted in FIG. 13, step 650 comprises forming a first opening 162 and a second opening 164 in the upper LK dielectric layer 160 through the supporting layer 150, and further forming the second opening 164 in the middle LK dielectric layer 140 through the lower ESL 130. For example, the first opening 162 includes a trench through the supporting layer 150, and the second opening 164 includes a trench through the supporting layer 150 and a via plug hole through the lower ESL 130. The first opening 162 and the second opening 164 are formed by a photolithography process (e.g., patterning the hard mask layer 185 first) followed by a dry etching process containing plasma. A layer 145 of processed (e.g., plasma damaged) LK dielectric material is formed along a wall of the first opening 162 and/or the second opening 164 during the dry etching process. The dry etching process containing plasma makes a carbon concentration of the layer 145 become lower than that of the non-processed LK dielectric material. The processed LK dielectric material has a higher dielectric constant (k) than the non-processed LK dielectric material does. Too much processed LK dielectric material will make the k value of the upper LK dielectric layer 160 (and/or the middle LK dielectric layer 140) unpredictable. In some embodiments, the layer 145 has a width in a range from about 1 Å to about 100 Å.

As depicted in FIG. 14, step 650 comprises forming a metal layer 165 in the first opening 162 and the second opening 164. As depicted in FIG. 15, step 650 comprises performing CMP on at least one of the upper LK dielectric layer 160 or the metal layer 165 to form the first conductive feature 470 and the second conductive feature 474.

Figure 16A:
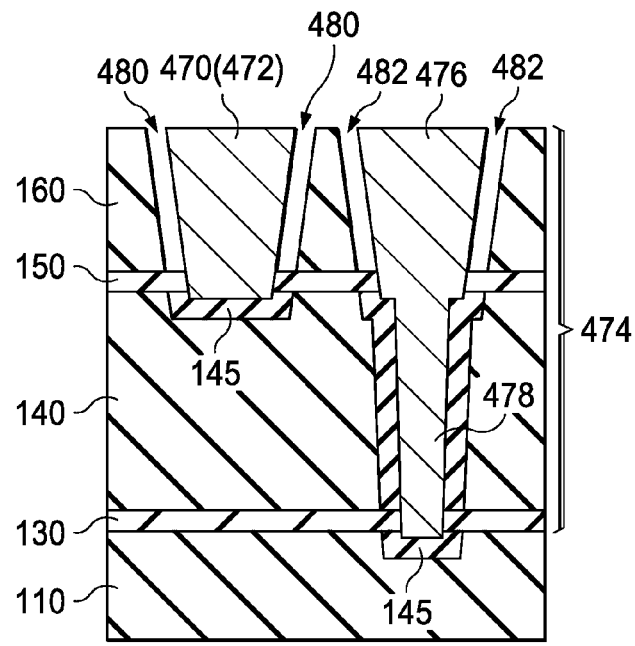

As depicted in FIG. 16A, and step 660 in FIG. 11, the method 600 continues with step 660 by forming a first gap 480 along an interface of the first conductive feature 470 and the upper LK dielectric layer 160, and a second gap 482 along an interface of the second conductive feature 474 and the upper LK dielectric layer 160. In some embodiments, step 660 is performed by removing a portion of the upper LK dielectric layer 160 along the interface by a wet etching process. The wet etching process may use a chemical including fluorine-containing species and metal inhibitors. As mentioned above, the layer 145 of processed (e.g., plasma damaged) LK dielectric material is formed along a wall of the first opening 162 and/or the second opening 164 during the dry etching process. Actually, the LK dielectric material along the wall of the first opening 162 and/or the second opening 164 is associated with a wall etch rate by the wet etching process. Additionally, the LK dielectric material along a top portion of the upper LK dielectric layer 160 is associated with a top etch rate by the wet etching process. Typically, the wall etch rate is different from the top etch rate. For example, processed LK dielectric material is generally associated with a faster etch rate, such as a processed etch rate, than non-processed LK dielectric material associated with a non-processed etch rate, thus making the processed LK dielectric material more easily removable than the non-processed LK dielectric material. Because the carbon concentration of the processed LK dielectric material is lower than that of the non-processed LK dielectric material (caused by the dry etching process containing plasma), the structure of the processed LK dielectric material is weaker and easier to be removed by the wet etching process. For example, the wall etch rate is associated with the processed etch rate, and the top etch rate is associated with the non-processed etch rate. Once the layer 145 of processed LK dielectric material is removed, the first gap 480 is formed along the interface of the first conductive feature 470 and the upper LK dielectric layer 160. Similarly, the second gap 482 is formed along the interface of the second conductive feature 474 and the upper LK dielectric layer 160. In some embodiments, the supporting layer 150 is configured to provide support, such as physical or mechanical support, for the first metal line 472 of the first conductive feature 470 (or the second metal line 476 of the second conductive feature 474) when the first gap 480 (or the second gap 482) is formed.

Figure 16B:
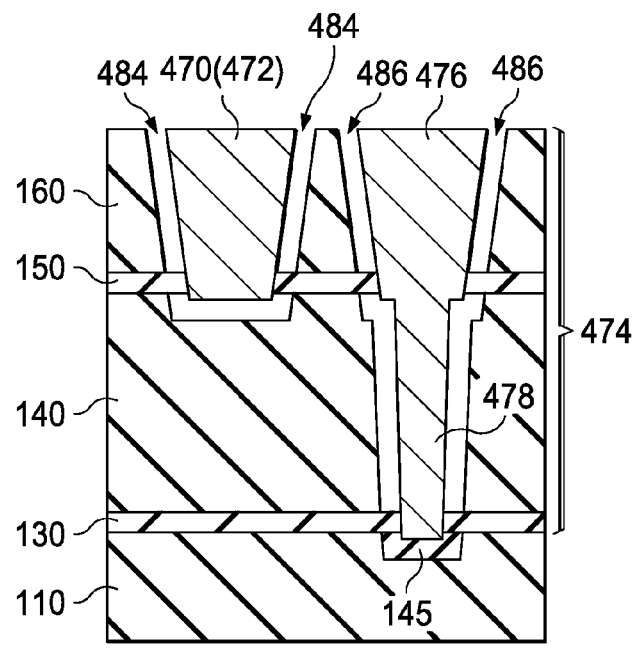

As depicted in FIG. 16B, in addition to forming a first gap 484 along an interface of the first conductive feature 470 and the upper LK dielectric layer 160, and a second gap 486 along an interface of the second conductive feature 474 and the upper LK dielectric layer 160, the method 600 may further comprise forming the first gap 484 along an interface of the first conductive feature 470 and the middle LK dielectric layer 140, and the second gap 486 along an interface of the second conductive feature 474 and the middle LK dielectric layer 140. In some embodiments, it is performed by further removing a portion of the middle LK dielectric layer 140 along the interface by the wet etching process. Once the layer 145 of processed LK dielectric material is removed, the first gap 484 is formed along the interface of the first conductive feature 470 and the upper LK dielectric layer 160, and along the interface of the first conductive feature 470 and the middle LK dielectric layer 140. Similarly, the second gap 486 is formed along the interface of the second conductive feature 474 and the upper LK dielectric layer 160, and along the interface of the second conductive feature 474 and the middle LK dielectric layer 140. In some embodiments, the supporting layer 150 is configured to provide support, such as physical or mechanical support, for the first conductive feature 470 (or the second conductive feature 474) when the first gap 484 (or the second gap 486) is formed. In some embodiments, the lower ESL 130 is configured to provide support, such as physical or mechanical support, for the via 478 of the second conductive feature 474 when the second gap 486 is formed.

Figure 16C:
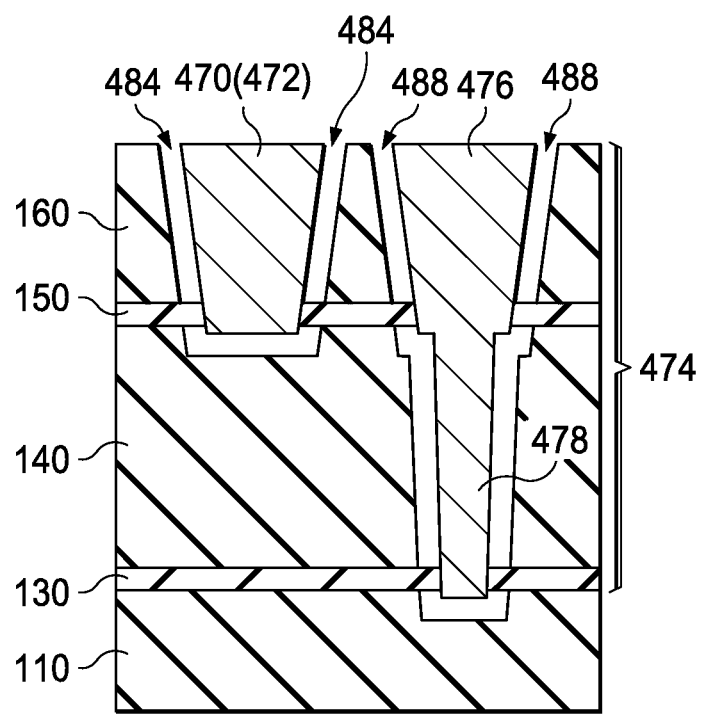

As depicted in FIG. 16C, in addition to forming a second gap 488 along an interface of the second conductive feature 474 and the upper LK dielectric layer 160, and along the second conductive feature 474 and the middle LK dielectric layer 140, the method 600 may further comprise forming the second gap 488 along an interface of the second conductive feature 474 and the lower LK dielectric layer 110. In some embodiments, it is performed by further removing a portion of the lower LK dielectric layer 110 along the interface by the wet etching process. Once the layer 145 of processed LK dielectric material is removed, the first gap 484 is formed along the interface of the first conductive feature 470 and the upper LK dielectric layer 160, and along the interface of the first conductive feature 470 and the middle LK dielectric layer 140. Similarly, the second gap 488 is formed along the interface of the second conductive feature 474 and the upper LK dielectric layer 160, along the interface of the second conductive feature 474 and the middle LK dielectric layer 140, and along the interface of the second conductive feature 474 and the lower LK dielectric layer 110. In some embodiments, the supporting layer 150 is configured to provide support, such as physical or mechanical support, for the first conductive feature 470 (or the second conductive feature 474) when the first gap 484 (or the second gap 488) is formed. In some embodiments, the lower ESL 130 is configured to provide support, such as physical or mechanical support, for the via 478 of the second conductive feature 474 when the second gap 488 is formed.

FIG. 16B is similar to FIG. 16A except that a bottom surface of the first gap 484 in FIG. 16B is lower than a bottom surface of the first gap 480 in FIG. 16A, and that a bottom surface of the second gap 486 in FIG. 16B is lower than a bottom surface of the second gap 482 in FIG. 16A. The difference between the first gap 480 and the first gap 484 (or between the second gap 482 and the second gap 486) can be controlled by the wet etching time. When the wet etching time is short, the processed LK dielectric material over the supporting layer 150 will be removed. When the wet etching time becomes longer, the processed LK dielectric material under the supporting layer 150 will also be removed because the wet chemical can penetrate through an interface of the first conductive feature 470 and the supporting layer 150 (or an interface of the second conductive feature 474 and the supporting layer 150). That's why the bottom surface of the first gap 480 (or the second gap 482) is over the supporting layer 150 while the bottom surface of the first gap 484 (or the second gap 486) is below the supporting layer 150.

FIG. 16C is similar to FIG. 16B except that a bottom surface of the second gap 488 in FIG. 16C is lower than the bottom surface of the second gap 486 in FIG. 16B. Similarly, the difference between the second gap 488 and the second gap 486 can be controlled by the wet etching time. When the wet etching time becomes much longer, the processed LK dielectric material under the lower ESL 130 will also be removed because the wet chemical can penetrate through an interface of the second conductive feature 474 and the lower ESL 130. That's why the bottom surface of the second gap 486 is over the lower ESL 130 while the bottom surface of the second gap 488 is below the lower ESL 130. In some embodiments, the via 478 may be further connected to a lower conductive feature. The bottom surface of the second gap 488 is substantially coplanar with a bottom surface of the lower ESL 130 and over the lower conductive feature.

As depicted in FIGS. 4A-4C, and step 670 in FIG. 11, the method 600 continues with step 670 by forming an upper ESL 190 over the upper LK dielectric layer 160, the first conductive feature 470, the second conductive feature 474, the first gap 480 (or 484), and the second gap 482 (or 486, 488).

The methods of the present disclosure are not limited to be used by a planar device on the substrate and can be applied to a non-planar device as well, such as a fin-like field effect transistor (FinFET). Based on the discussions above, it can be seen that by using the methods of the present disclosure, the dielectric constant (k) of the LK dielectric material is reduced by forming a gap along an interface of the upper conductive feature and the upper LK dielectric layer (or further along an interface of the upper conductive feature and the middle LK dielectric layer). When the gap is formed, the supporting layer is configured to provide support, such as physical or mechanical support, for the metal line of the upper conductive feature. Since processed LK dielectric material is generally associated with a faster etch rate, such as a processed etch rate, than non-processed LK dielectric material associated with a non-processed etch rate, the processed LK dielectric material is more easily removable than the non-processed LK dielectric material. By controlling the wet etching time, the bottom surface of the gap is either over or below the supporting layer. Additionally, the bottom surface of the gap may be either over or below the lower ESL. Furthermore, the bottom surface of the gap may be substantially coplanar with a bottom surface of the lower ESL and over the lower conductive feature. As a result, the RC performance of the device can be well controlled by using the methods of the present disclosure.

One of the broader forms of the present disclosure involves an interconnect structure. The interconnect structure comprises a lower etch stop layer (ESL); a middle low-k (LK) dielectric layer over the lower ESL; a supporting layer over the middle LK dielectric layer; an upper LK dielectric layer over the supporting layer; an upper conductive feature in the upper LK dielectric layer, wherein the upper conductive feature is through the supporting layer; a gap along an interface of the upper conductive feature and the upper LK dielectric layer; and an upper ESL over the upper LK dielectric layer, the upper conductive feature, and the gap.

Another of the broader forms of the present disclosure involves an interconnect structure. The interconnect structure comprises a lower etch stop layer (ESL); a middle low-k (LK) dielectric layer over the lower ESL; a supporting layer over the middle LK dielectric layer; an upper LK dielectric layer over the supporting layer; a first conductive feature having a first metal line in the upper LK dielectric layer, wherein the first metal line is through the supporting layer; a second conductive feature having a second metal line in the upper LK dielectric layer and a via contiguous with the second metal line in the middle LK dielectric layer, wherein the second metal line is through the supporting layer and the via is through the lower ESL; a first gap along an interface of the first conductive feature and the upper LK dielectric layer; a second gap along an interface of the second conductive feature and the upper LK dielectric layer; and an upper ESL over the upper LK dielectric layer, the first conductive feature, the second conductive feature, the first gap, and the second gap.

Still another of the broader forms of the present disclosure involves a method of forming an interconnect structure. The method comprises forming a lower etch stop layer (ESL); forming a middle low-k (LK) dielectric layer over the lower ESL; forming a supporting layer over the middle LK dielectric layer; forming an upper LK dielectric layer over the supporting layer; forming an upper conductive feature in the upper LK dielectric layer through the supporting layer; forming a gap along an interface of the upper conductive feature and the upper LK dielectric layer; and forming an upper ESL over the upper LK dielectric layer, the upper conductive feature, and the gap.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An interconnect structure, comprising:
    a first etch stop layer (ESL);
    a first low-k (LK) dielectric layer over the first ESL;
    a supporting layer over the first LK dielectric layer;
    a second LK dielectric layer over the supporting layer;
    a first conductive feature in the second LK dielectric layer, the first conductive feature extending through the supporting layer, the supporting layer physically supporting the first conductive feature;
    a gap between the first conductive feature and the second LK dielectric layer and between the first conductive feature and the first LK dielectric layer, the gap contacting a first surface portion of the first conductive feature over the supporting layer and a second surface portion of the first conductive feature below the supporting layer; and
    a second ESL over the second LK dielectric layer, the first conductive feature, and the gap.

2. The interconnect structure of claim 1, wherein the gap comprises air.

3. The interconnect structure of claim 1, wherein the gap extends under a bottom surface of the first etch stop layer.

4. The interconnect structure of claim 1, wherein the first conductive feature comprises a metal line, the metal line extending through the supporting layer.

5. The interconnect structure of claim 4, wherein a bottom surface of the supporting layer is over a bottom surface of the metal line.

6. The interconnect structure of claim 4, wherein the first conductive feature further comprises a via in the first LK dielectric layer, the via being contiguous with the metal line and through the first ESL.

7. The interconnect structure of claim 6, wherein the gap further contacts a surface portion of the via and is between the via and the first LK dielectric layer.

8. The interconnect structure of claim 7, wherein the gap is over a bottom surface of the first ESL.

9. The interconnect structure of claim 7, wherein the gap extends below a bottom surface of the first ESL.

10. The interconnect structure of claim 1, further comprising:
    a third LK dielectric layer below the first ESL; and
    a second conductive feature in the third LK dielectric layer.

11. The interconnect structure of claim 10, wherein the second conductive feature comprises a metal line or a gate electrode.

12. The interconnect structure of claim 10, wherein the first conductive feature further comprises a via in the first LK dielectric layer, the via extending through the first ESL and connected to the second conductive feature.

13. The interconnect structure of claim 12, wherein the gap is further along an interface of the via and the first LK dielectric layer, and wherein the gap is over the second conductive feature.

14. An interconnect structure, comprising:
    a first etch stop layer (ESL);
    a first low-k (LK) dielectric layer over the first ESL;
    a supporting layer over the first LK dielectric layer;
    a second LK dielectric layer over the supporting layer;
    a first conductive feature in the second LK dielectric layer, the first conductive feature extending through the supporting layer, the supporting layer physically supporting the first conductive feature;

a second conductive feature in the first LK dielectric layer extending from the first conductive feature and through the first ESL;

a gap between the first conductive feature and the second LK dielectric layer and between the second conductive feature and the first LK dielectric layer, the gap contacting a surface portion of the first conductive feature over the supporting layer and a surface portion of the second conductive feature below the supporting layer; and a second ESL over the second LK dielectric layer, the first conductive feature, and the gap.

15. The interconnect structure of claim 14, wherein the gap comprises air.

16. The interconnect structure of claim 14, wherein the gap further extends under a bottom surface of the first ESL.

17. The interconnect structure of claim 14, wherein the first conductive feature comprises a metal line, the metal line extending through the supporting layer.

18. A structure comprising:
a first low-k (LK) dielectric layer;
a supporting layer over the first LK dielectric layer;
a second LK dielectric layer;
a conductive feature extending through the second LK dielectric layer and the supporting layer and into the first LK dielectric layer, the supporting layer physically supporting the conductive feature, an air gap contacting a first sidewall surface of the conductive feature above the supporting layer and extends between the first sidewall surface of the conductive feature and the second LK dielectric layer, the air gap further contacting a second sidewall surface of the conductive feature below the supporting layer and extends between the second sidewall surface and the first LK dielectric layer; and
an etch stop layer (ESL) over the conductive feature and the second LK dielectric layer.

19. The structure of claim 18, wherein the conductive feature includes a metal line and a via contiguously extending from the metal line.

20. The structure of claim 18, further comprising:
a third LK dielectric layer below the first LK; and
a second conductive feature in the third LK dielectric layer.

* * * * *